(12) United States Patent
Terashima

(10) Patent No.: US 6,586,799 B1
(45) Date of Patent: Jul. 1, 2003

(54) SEMICONDUCTOR DEVICE AND METHOD OF MANUFACTURING SAME

(75) Inventor: Tomohide Terashima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/325,047

(22) Filed: Jun. 3, 1999

(30) Foreign Application Priority Data

Dec. 22, 1998 (JP) .......................................... 10-365251

(51) Int. Cl.[7] .............................................. H01L 29/76
(52) U.S. Cl. ........................ 257/329; 257/339; 257/341
(58) Field of Search ................................ 438/268, 138; 257/329, 335, 336, 341, 342, 339

(56) References Cited

U.S. PATENT DOCUMENTS

| 4,376,286 A | * | 3/1983 | Lidow et al. ............... 257/341 |
| 4,593,302 A | * | 6/1986 | Lidow et al. ............... 257/341 |
| 5,016,066 A | * | 5/1991 | Takahashi .................... 357/52 |
| 5,757,046 A | * | 5/1998 | Fujihira et al. ............. 257/339 |
| 5,891,776 A | * | 4/1999 | Han et al. .................... 438/274 |
| 5,915,179 A | * | 6/1999 | Etou et al. ................... 438/268 |
| 5,939,752 A | * | 8/1999 | Williams .................... 257/339 |
| 6,081,009 A | * | 6/2000 | Neilson ....................... 257/341 |
| 6,198,141 B1 | * | 3/2001 | Yamazaki et al. .......... 257/404 |

FOREIGN PATENT DOCUMENTS

JP            3-77377           4/1991

* cited by examiner

*Primary Examiner*—Michael Trinh
(74) *Attorney, Agent, or Firm*—Oblon, Spivak, McClelland, Maier & Neustadt, P.C.

(57) ABSTRACT

A semiconductor device includes a semiconductor layer having a main surface (100a), a first region (101) of a first conductivity type, a second region (102) of a second conductivity type, and a third region (103) of the second conductivity type, the first region (101) and the second region (102) having a first boundary (101a) formed therebetween, the first boundary (101a) being perpendicular to the main surface (100a), the third region (103) being formed in the first region (101) in spaced apart relation to the second region (102), the third region (103) having a depth less than the depth of the first boundary (101a) from the main surface (100a); and a control electrode (201) insulated from and overlying the main surface (100a) and extending from the first boundary (101a) to a second boundary (101b) formed between the first region (101) and the third region (103). The semiconductor device improves a tradeoff between breakdown voltage and on-resistance. A method of manufacturing the semiconductor device is also provided.

3 Claims, 10 Drawing Sheets

SEMICONDUCTOR DEVICE AND METHOD OF MANUFACTURING SAME

BACKGROUND OF THE INVENTION

1. Field of the Invention

The present invention relates to discrete or integrated circuit semiconductor devices and a method of manufacturing the same.

2. Description of the Background Art

FIG. 20 shows a cross section of a background art output transistor. The output transistor of FIG. 20 comprises an $n^+$ semiconductor substrate 1b, an $n^-$ epitaxial layer 2b, p-type diffusion regions 191, $n^+$ diffusion regions 193 formed in the respective surfaces of the p-type diffusion regions 191, a control electrode 291, an insulation film 3b surrounding the control electrode 291, a source electrode 293 in contact with the insulation film 3b, the p-type diffusion regions 191 and the $n^+$ diffusion regions 193, and a drain electrode 292 in contact with the bottom surface of the semiconductor substrate 1b.

In the structure shown in FIG. 20, the p-type diffusion regions 191 and the $n^+$ diffusion regions 193 are formed using the insulation film 3b as a mask. The difference in lateral diffusion length between the p-type diffusion regions 191 and the $n^+$ diffusion regions 193 defines MOS channels CH.

The structure of FIG. 20 is known as a DMOS (Double diffused MOS) transistor. The DMOS transistor which uses the $n^-$ epitaxial layer 2b as an offset drain has a reduced gate length independently of photolithographic precision and can ensure the uniformity of the gate length. Therefore, DMOS transistors are most commonly used as high breakdown voltage devices which require low on-resistance.

A significant aim of the DMOS transistors is to improve a tradeoff between breakdown voltage and on-resistance. To achieve this aim, generally two approaches to such an improvement have been made.

The first approach is to increase the mask alignment precision of a stepper to reduce the size of devices, thereby improving the tradeoff between breakdown voltage and on-resistance.

The second approach is to shorten a channel length by making the p-type diffusion regions 191 and the $n^+$ diffusion regions 193 shallower to reduce a JFET resistance between the pair of p-type diffusion regions 191, thereby improving the tradeoff between breakdown voltage and on-resistance.

However, the first approach provides an improvement effect which substantially reaches a point of saturation since the precision of mask alignment at the current level may be considered equivalent to the processing precision of an entire process. Therefore, the first approach is not expected to provide a further considerable improvement in the tradeoff between breakdown voltage and on-resistance.

It is hence considered to apply the second approach to the first approach. Unfortunately, the second approach can reduce the channel length and the JFET resistance, but is not capable of suppressing the increase in curvature of a diffusion corner. The increase in curvature of a diffusion corner decreases the breakdown voltage. Thus, the application of the second approach to the first approach encounters limitation of the improvement in the tradeoff between breakdown voltage and on-resistance.

SUMMARY OF THE INVENTION

According to a first aspect of the present invention, a semiconductor device comprises: a semiconductor layer including a main surface, a first region of a first conductivity type, a second region of a second conductivity type, and a third region of the second conductivity type, the first region and the second region having a first boundary formed therebetween, the first boundary being perpendicular to the main surface, the third region being formed in the first region in spaced apart relation to the second region, the third region having a depth less than the depth of the first boundary from the main surface; and a control electrode insulated from and overlying the main surface and extending from the first boundary to a second boundary formed between the first region and the third region.

Preferably, according to a second aspect of the present invention, in the semiconductor device of the first aspect, the first region has an impurity concentration decreasing with increase in distance from the main surface of the semiconductor layer.

Preferably, according to a third aspect of the present invention, in the semiconductor device of the first aspect, the main surface has a polygonal plan configuration, and the first region is disposed at a vertex of the polygonal plan configuration.

According to a fourth aspect of the present invention, a method of manufacturing a semiconductor device comprises the steps of: (a) implanting a first impurity of a first conductivity type and a second impurity of a second conductivity type into a first region formed in a main surface of a semiconductor layer and a second region adjacent to the first region, respectively; (b) heat-treating a resultant structure provided in the step (a) to diffuse the first and second impurities; and (c) forming a third region of the second conductivity type in the main surface in the first region in spaced apart relation to the second region, and forming a control electrode insulated from and overlying the main surface, the control electrode extending from a first boundary formed between the first and second regions to a second boundary formed between the first and third regions.

Preferably, according to a fifth aspect of the present invention, in the method of the fourth aspect, the step (a) comprises the steps of: (a-1) covering at least the first and second regions in the main surface of the semiconductor layer with an oxide film; (a-2) covering part of the oxide film which overlies at least one of the first and second regions with a mask; (a-3) implanting one of the first and second impurities into the other of the first and second regions, the step (a-3) being performed after the step (a-2); (a-4) oxidizing part of the oxide film which is exposed over the other of the first and second regions to increase the thickness of the part of the oxide film, the step (a-4) being performed after the step (a-3); (a-5) removing the mask, the step (a-5) being performed after the step (a-4); and (a-6) implanting the other of the first and second impurities into the one of the first and second regions, the step (a-6) being performed after the step (a-5). The method further comprises the step of (d) removing the oxide film, the step (d) being performed prior to the step (c).

In accordance with the first aspect of the present invention, the first boundary between the first and second regions is perpendicular to the main surface to suppress the decrease in breakdown voltage. Additionally, the second region of the second conductivity type may greatly reduce on-resistance. Therefore, the present invention improves a tradeoff between breakdown voltage and on-resistance.

In accordance with the second aspect of the present invention, if a diffusion corner having a great curvature is developed at the bottom of the first region, the low concentration of the first impurity in the first region may suppress the decrease in the breakdown voltage.

In accordance with the third aspect of the present invention, the boundary between the first and second region contains at least the first boundary. This accordingly alleviates electric field concentration to render the semiconductor device less susceptible to breakdown.

In accordance with the fourth aspect of the present invention, the first boundary perpendicular to the main surface of the semiconductor layer is formed between the first and second regions. Additionally, the concentrations of the first and second impurities in the first and second regions decrease with the increase in distance from the main surface of the semiconductor layer. Therefore, if a diffusion corner having a great curvature is developed at the bottom of the first region, the semiconductor device in which the decrease in breakdown voltage is suppressed is achieved.

In accordance with the fifth aspect of the present invention, a bird's beak is formed additionally in the step (a-4). A region immediately under the bird's beak contains few first and second impurities. The presence of a gap containing few impurities prevents the position of the first boundary between the first and second regions from being shifted out of the region immediately under the bird's beak, to provide the first boundary which is substantially stable and planar.

It is therefore an object of the present invention to provide a novel semiconductor device which improves a tradeoff between breakdown voltage and on-resistance, and a method of manufacturing the same.

These and other objects, features, aspects and advantages of the present invention will become more apparent from the following detailed description of the present invention when taken in conjunction with the accompanying drawings.

DESCRIPTION OF THE PREFERRED EMBODIMENTS

Concept of the Invention

Figure 1:
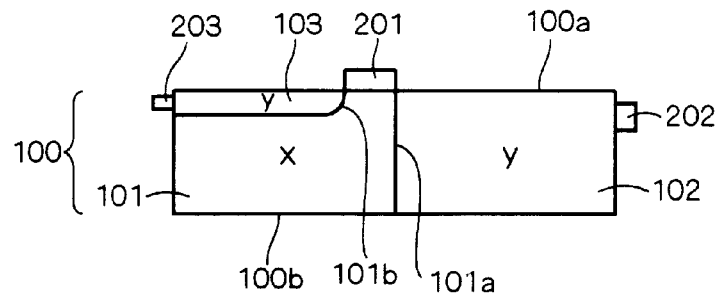
FIG. 1 is a cross-sectional view showing the concept of a semiconductor device according to the present invention.

FIG. 1 is a cross-sectional view showing the concept of a semiconductor device according to the present invention. The semiconductor device shown in FIG. 1 comprises a semiconductor layer 100, a control electrode 201, a second current electrode 202, and a first current electrode 203. The semiconductor layer 100 includes a first region 101, a second region 102, and a third region 103. One of the surfaces of the semiconductor layer 100 on which the control electrode 201 is disposed is referred to as a main surface 100a.

The first region 101 contains a first impurity of a first conductivity type x diffused from the main surface 100a of the semiconductor layer 100. One of the first conductivity type x and a second conductivity type y is an n type, and the other is a p type.

The second region 102 is adjacent to the first region 101, and contains a second impurity of the second conductivity type y diffused from the main surface 100a of the semiconductor layer 100.

The third region 103 of the first conductivity type x is formed in the main surface 100a in the first region 101 so as not to contact the second region 102. It should be noted that the first region 101, the second region 102 and the third region 103 are required only to form a pnp junction or an npn junction, and therefore all of the surfaces of the third region 103 need not be surrounded by the first region 101 as shown in FIG. 1.

The first region 101 and the second region 102 have a first boundary 101a formed therebetween, and the first region 101 and the third region 103 have a second boundary 101b formed therebetween. The first boundary 101a adjacent to the main surface 100a is perpendicular to the main surface 100a. The depth of the third region 103 from the main surface 100a is less than the depth of the first boundary 101a from the main surface 100a.

The control electrode 201 is required only to be provided so as to function as a gate electrode of a MOS transistor. Thus, the control electrode is required only to cover at least a region in which a channel is formed, i.e. part of the main surface 100a which extends from the first boundary 101a to the second boundary 101b, and to be insulated from the main surface 100a. The second current electrode 202 and the first current electrode 203 are required only to be provided so as to be electrically connected to the second region 102 and the third region 103, respectively.

Figure 20:
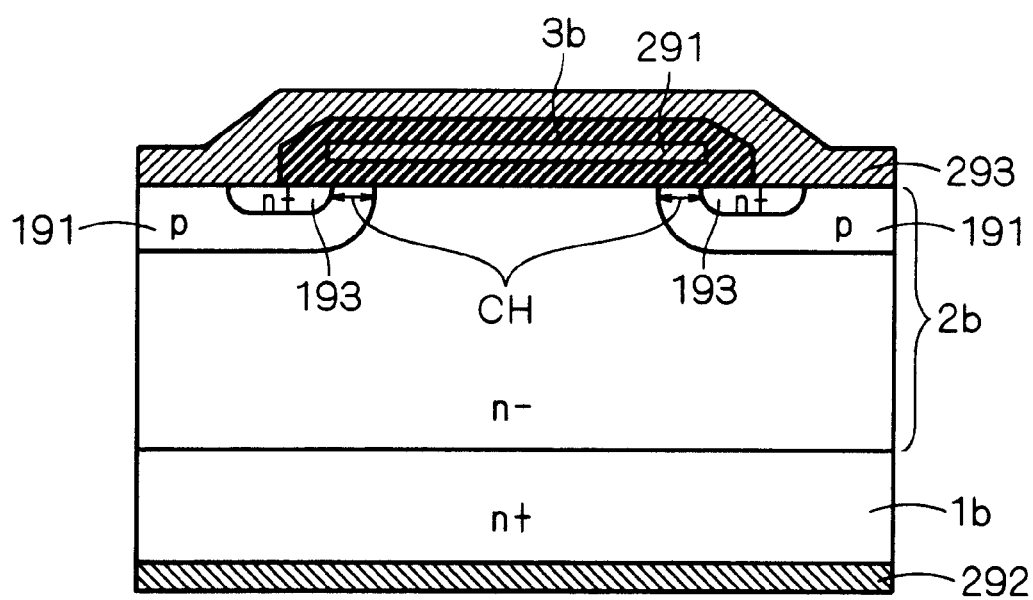
FIG. 20 is a cross-sectional view showing a background art method of manufacturing a semiconductor device.

The first region 101 has the first boundary 101a that is planar and in contact with the second region 102 in a range from the main surface 100a to the inside of the semiconductor layer 100. This suppresses the increase in the curvature of a diffusion corner to thereby suppress the decrease in breakdown voltage, as compared with the background art. Further, since the second region 102 (FIG. 1) corresponding to the $n^-$ epitaxial layer $2b$ and the semiconductor substrate $1b$ of the background art shown in FIG. 20 contains the second impurity of the second conductivity type y diffused therein, the semiconductor device of the present invention has an on-resistance much lower than that of the background art semiconductor device. Therefore, the present invention provides a further improvement in a tradeoff between breakdown voltage and on-resistance over the background art.

Figure 2:
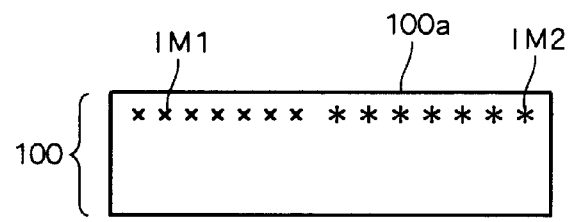
FIGS. 2 and 3 are cross-sectional views showing a method of manufacturing the semiconductor device according to the present invention.

A method of forming the structure of FIG. 1 will be discussed with reference to FIGS. 2 and 3. The formation of the second region 102 is utilized to form the first region 101 having the planar first boundary 101a. Specifically, impurities are implanted into the main surface 100a so that the concentration of the impurities is uniform throughout the main surface 100a (FIG. 2). The impurities implanted into the main surface 100a include a first impurity IM1 of the first conductivity type x which is introduced into the first region 101, and a second impurity IM2 of the second conductivity type y which is introduced into the second region 102.

Next, heat treatment is performed on the structure shown in FIG. 2 to diffuse the first impurity IM1 and the second impurity IM2 similarly in the semiconductor layer 100. As a result, the first region 101 is formed having the first boundary 101a that is planar and in contact with the second region 102 in the range from the main surface 100a to the inside of the semiconductor layer 100. The concentration of the first impurity IM1 in the first region 101 and the concentration of the second impurity IM2 in the second region 102 decrease with the increase in distance from the main surface 100a of the semiconductor layer 100 (FIG. 3).

Figure 3:
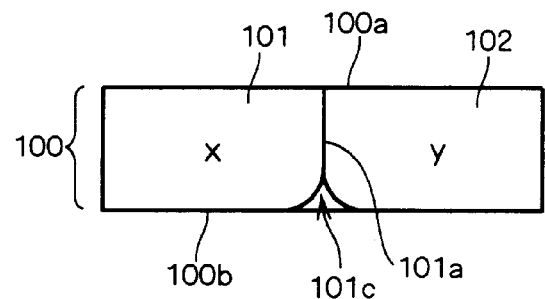

In the structure of FIG. 3, part of the first region 101 which is closer to the main surface 100a of the semiconductor layer 100 has the first boundary 101a that is planar at a side surface thereof to suppress the decrease in breakdown voltage. On the other hand, part of the first region 101 which is closer to a bottom surface 100b of the semiconductor layer 100 contains the first impurity IM1 of a lower concentration to suppress the decrease in breakdown voltage even if a diffusion corner 101c having a large curvature is developed at the bottom of the semiconductor layer 100.

Finally, the third region 103, the control electrode 201, the second current electrode 202 and the first current electrode 203 are formed to complete the structure of FIG. 1.

Applications of the above described concept of the present invention will be described in the form of first to fourth preferred embodiments.

First Preferred Embodiment

Figure 4:
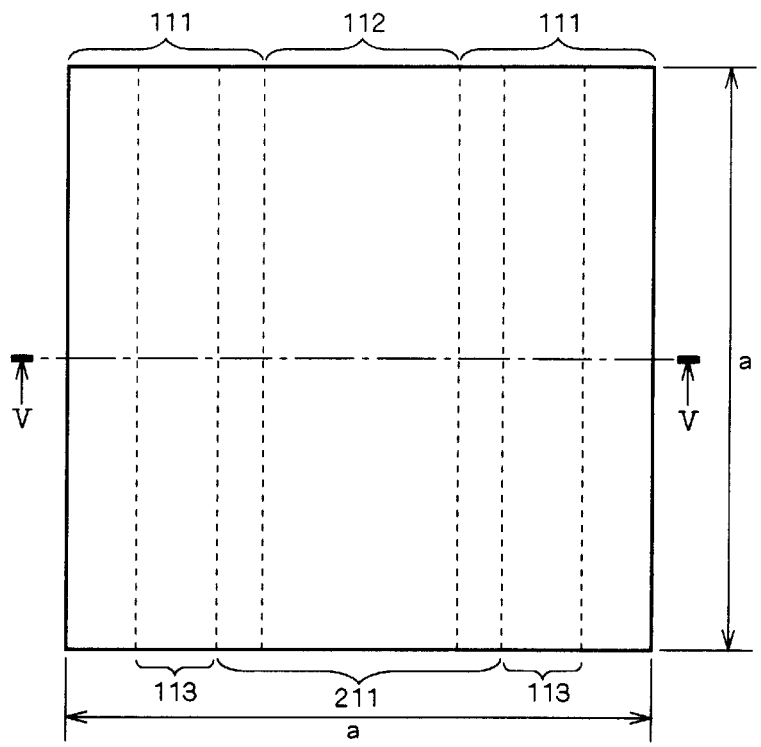
FIG. 4 is a plan view of the semiconductor device according to a first preferred embodiment of the present invention.
Figure 5:
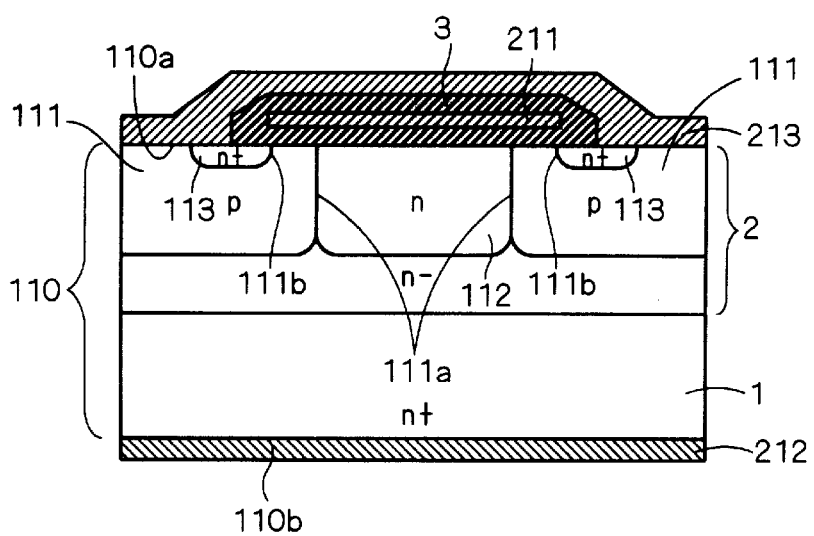
FIG. 5 is a cross-sectional view of the semiconductor device according to the first preferred embodiment of the present invention.

FIG. 4 is a plan view of the semiconductor device according to the first preferred embodiment of the present invention. FIG. 5 is a cross-sectional view taken along the line V—V of FIG. 4. The semiconductor device of the first preferred embodiment is a discrete output transistor.

The semiconductor device of the first preferred embodiment comprises a semiconductor layer 110, a control electrode 211, a drain electrode 212, a source electrode 213, and an insulation film 3.

The semiconductor layer 110 includes an $n^+$ semiconductor substrate 1, and an $n^-$ epitaxial layer 2 formed on the semiconductor substrate 1. The $n^-$ epitaxial layer 2 includes a pair of p-type diffusion regions 111, an n-type diffusion region 112 between the pair of p-type diffusion regions 111, and a pair of $n^+$ diffusion region 113 selectively formed in respective main surfaces of the pair of p-type diffusion regions 111 in spaced apart relation to the n-type diffusion region 112. The insulation film 3 surrounds the surfaces of the control electrode 211.

Each of the p-type diffusion regions 111 and the n-type diffusion region 112 have a boundary 111a formed therebetween, and each of the p-type diffusion regions 111 and its associated $n^+$ diffusion region 113 have a boundary 111b formed therebetween. The boundaries 111a adjacent a main surface 110a is perpendicular to the main surface 110a. The depth of the $n^+$ diffusion regions 113 from the main surface 110a is less than the depth of the boundaries 11a from the main surface 110a.

The control electrode 211 overlies the main surface 110a of the semiconductor layer 110, with the insulation film 3 therebetween. The drain electrode 212 is provided beneath a bottom surface 110b of the semiconductor layer 110. The source electrode 213 covers the insulation film 3 and the main surface 110a.

The semiconductor layer 110, the main surface 110a, the bottom surface 110b, the p-type diffusion regions 111, the boundaries 111a, the boundaries 111b, the n-type diffusion region 112, the $n^+$ diffusion regions 113, the control electrode 211, the drain electrode 212 and the source electrode 213 according to the first preferred embodiment correspond respectively to the semiconductor layer 100, the main surface 100a, the bottom surface 100b, the first region 101, the first boundary 101a, the second boundary 101b, the second region 102, the third region 103, the control electrode 201, the second current electrode 202 and the first current electrode 203 which are described with respect to the concept of the present invention.

The p-type diffusion regions 111 and the n-type diffusion region 112 are formed in a manner described with respect to the concept of the present invention with reference to FIGS. 2 and 3. In the first preferred embodiment, however, impurities are implanted into the main surface 110a in a self-aligned manner in the step shown in FIG. 2. This will be described with reference to FIGS. 6 through 11.

Figure 6:
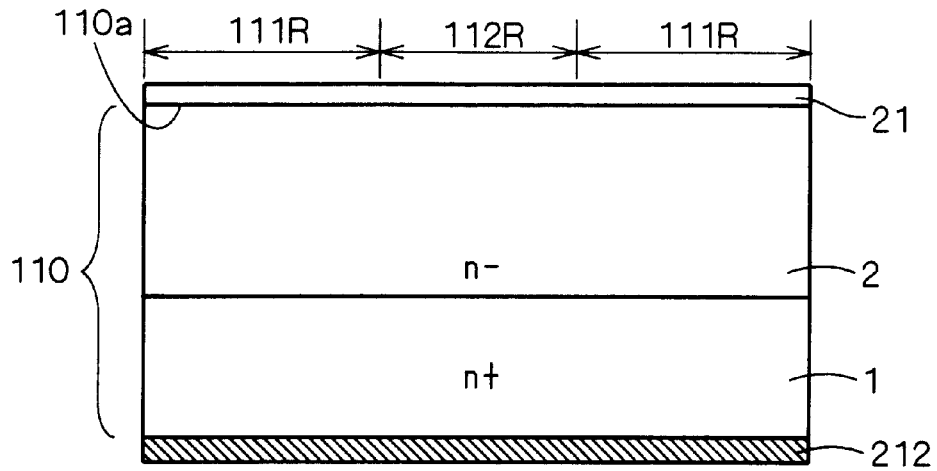
FIGS. 6 through 15 are cross-sectional views showing the method of manufacturing the semiconductor device according to the first preferred embodiment of the present invention.

First, the main surface 110a of the semiconductor layer 110 is oxidized to cover at least regions 111R and 112R in which the p-type diffusion regions 111 and the n-type diffusion region 112 are to be formed later respectively in the surface 110a of the semiconductor layer 110 with an oxide film 21 having a uniform thickness (FIG. 6).

Figure 7:
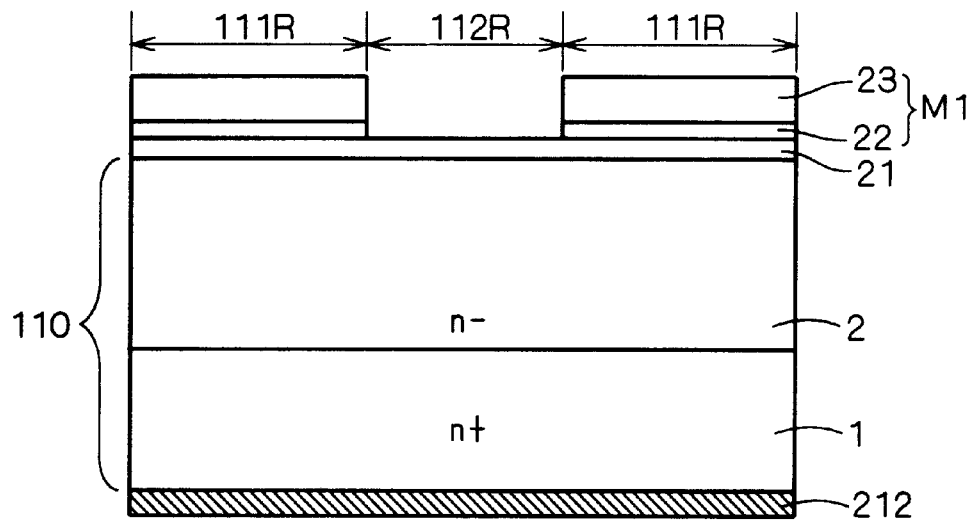

Then, the oxide film 21 is covered with, for example, a silicon nitride film 22. Subsequently, the silicon nitride film 22 is covered with a photoresist 23. The photoresist 23 is patterned using the photolithographic technique so that part of the photoresist 23 which overlies the region 112R is removed and part of the photoresist 23 which overlies the regions 111R is left. Next, the silicon nitride film 22 is etched using the photoresist 23 as a mask so that part of the silicon nitride film 22 which overlies the region 112R is removed and part of the silicon nitride film 22 which overlies the regions 111R is left. Thus, a mask M1 comprised of the silicon nitride film 22 and the photoresist 23 covers part of the oxide film 21 which overlies the regions 111R (FIG. 7).

Figure 8:
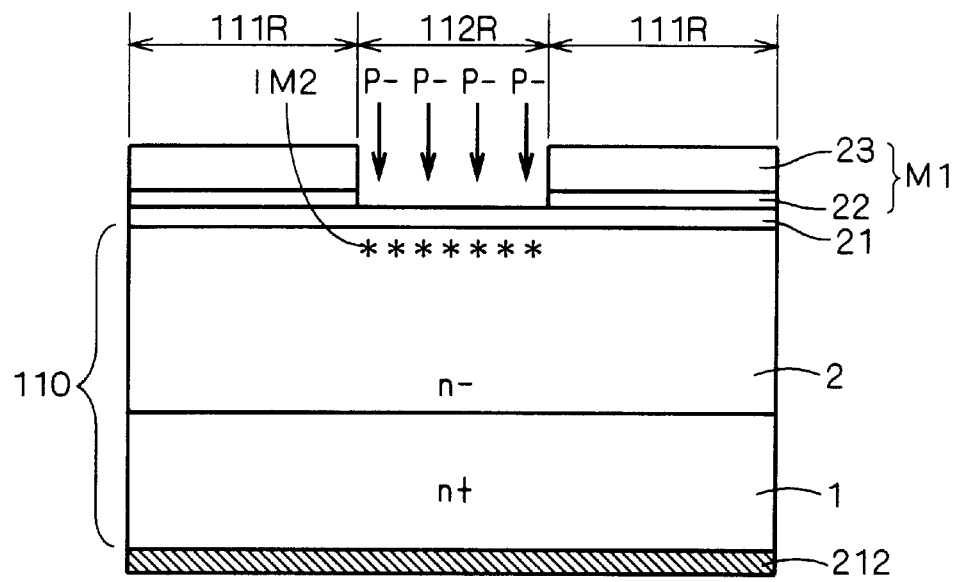

Next, phosphorus ions, for example, are implanted into the region 112R. No phosphorus ions are introduced into the regions 111R because of the presence of the mask M1 over the regions 111 (FIG. 8).

Figure 9:
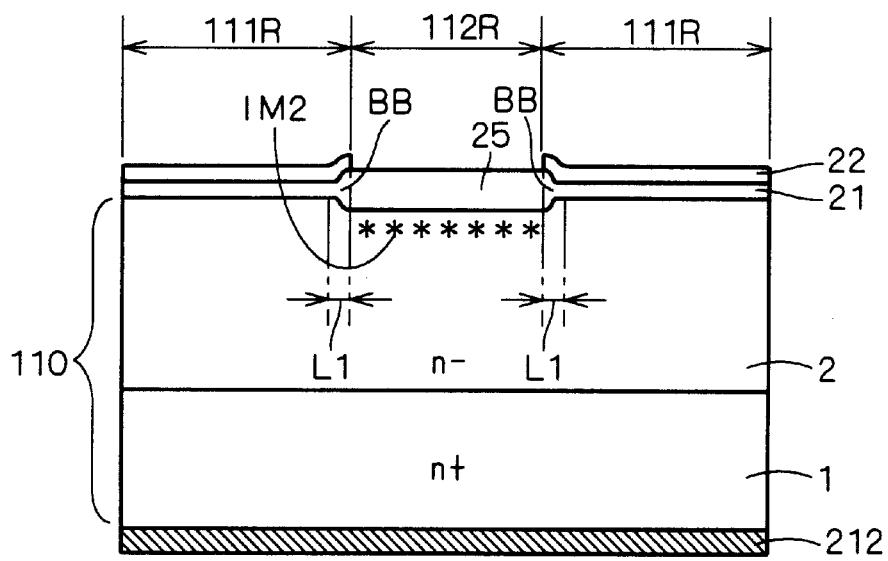

Thereafter, the photoresist 23 serving as part of the mask M1 is removed. The oxide film 21 is oxidized to increase the thickness of a region 25 of the oxide film 21 which is exposed over the region 112R (FIG. 9). At this time, a bird's beak BB grows in a region of the silicon nitride film 22 (mask) which is within a short distance L1 from an edge of the silicon nitride film 22.

Figure 10:
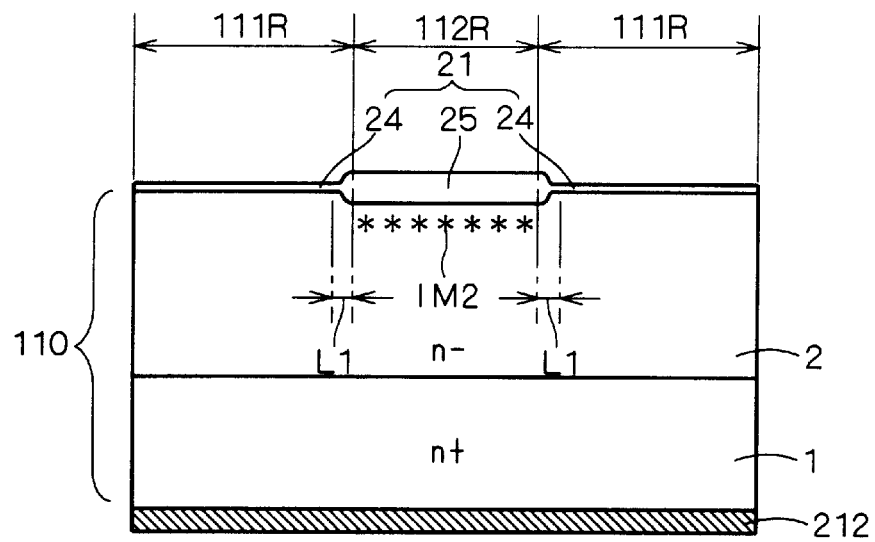

Then, the silicon nitride film 22 is removed (FIG. 10). If the oxide film 21 is also removed at this time, the region 25 is required to remain at least over the region 112R.

Figure 11:
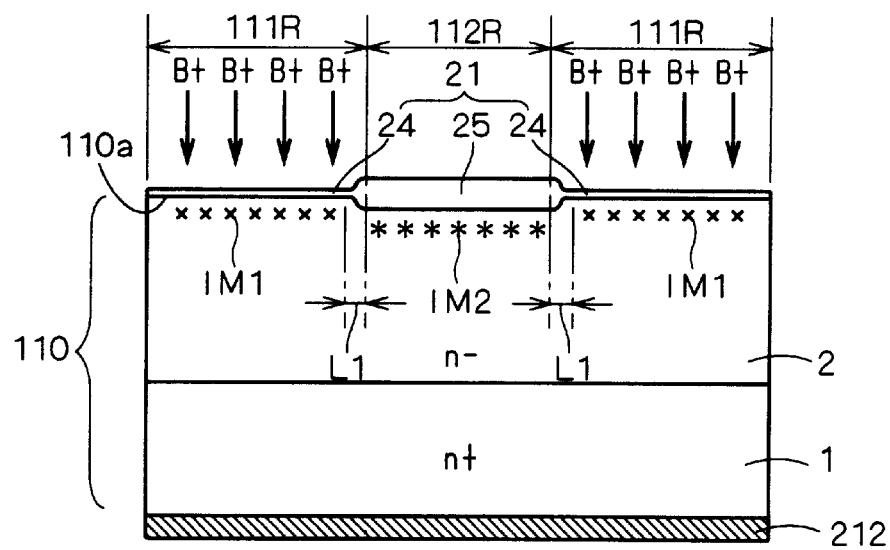

Next, boron ions, for example, are implanted into the regions 111R. The region 25 of the oxide film 21 over the region 112R is thicker than regions 24 of the oxide film 21 over the regions 111R. In other cases, the regions 24 are absent over the regions 111R, and the region 25 is present over the region 112R. Thus, no boron ions are introduced into the region 112R (FIG. 11).

It is desirable that the concentrations of the first and second impurities IM1 and IM2 are set in a manner to be described below to provide the planar boundaries 111a. It is known that an impurity is diffused in accordance with the Gaussian distribution: $C(X)=Q\times\exp(-X^2/4Dt)/\sqrt{(\pi Dt)}$ where D is a diffusion coefficient, t is diffusion time, X is a diffusion distance and Q is a dose. According to the Gaussian distribution, the concentration of the impurity decreases rapidly as the impurity is diffused from the main surface 100a toward the bottom surface 100b. In general, the n-type impurity concentration of the n⁻ epitaxial layer 2 which is previously set is about two orders of magnitude less than the impurity concentration of the n- and p-type wells. In this case, if the dose Q of one of the first and second impurities IM1 and IM2 is, for example, three times that of the other, the difference in diffusion distance X therebetween is about 25% of the diffusion distance X of the first impurity IM1 or the second impurity IM2. Therefore, it is desirable that the concentrations of the first and second impurities IM1 and IM2 are such that the dose of one of the first and second impurities IM1 and IM2 is not less than three times that of the other. For instance, the dose ratio of phosphorus to boron is $7.80\times10^{12}$ to $1.15\times10^{13}$.

As above described, the impurities are implanted into the main surface 110a in concentrations which render the boundaries 111a planar (FIGS. 6 through 11).

The heat treatment described with reference to FIG. 2 is performed on the structure of FIG. 11 to diffuse the first impurity IM1 (boron) and the second impurity IM2 (phosphorus) in the semiconductor layer 110 in unison. As a result, the p-type diffusion regions 111 are formed each having the planar boundary 111a that is in contact with the n-type diffusion region 112 in a range from the main surface 110a to the inside of the semiconductor layer 110 (FIG. 12).

Further, the regions lying within the short distance L1 are difficult to implant with boron because of the presence of the bird's beak. Hence, the regions lying within the short distance L1 contain few phosphorus and boron ions. The presence of such gaps containing few impurity ions prevents the position of the boundaries 111a of FIG. 12 from being shifted out of the regions lying within the distance L1, to provide the boundaries 111a which are substantially stable and planar.

Figure 13:
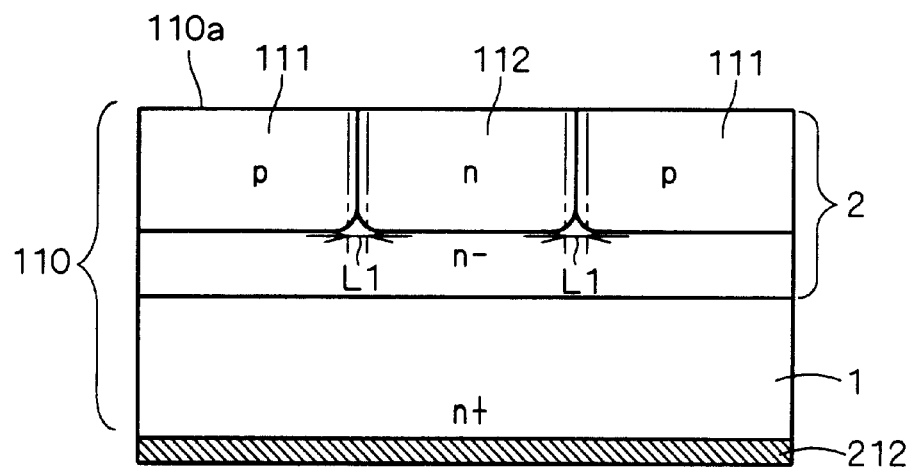

The oxide film 21 is completely removed (FIG. 13). Then, the control electrode 211 surrounded by the insulation film 3 is formed by the photolithographic technique on parts of the main surface 110a which overlie the n-type diffusion region 112 and parts of the p-type diffusion regions 111. Using the insulation film 3 as a mask, for example, phosphorus ions are implanted into the p-type diffusion regions 111 to form the n⁺ diffusion regions 113. Finally, the insulation film 3 and the main surface 110a is covered with the source electrode 213. This provides the structure of FIG. 5.

Figure 12:
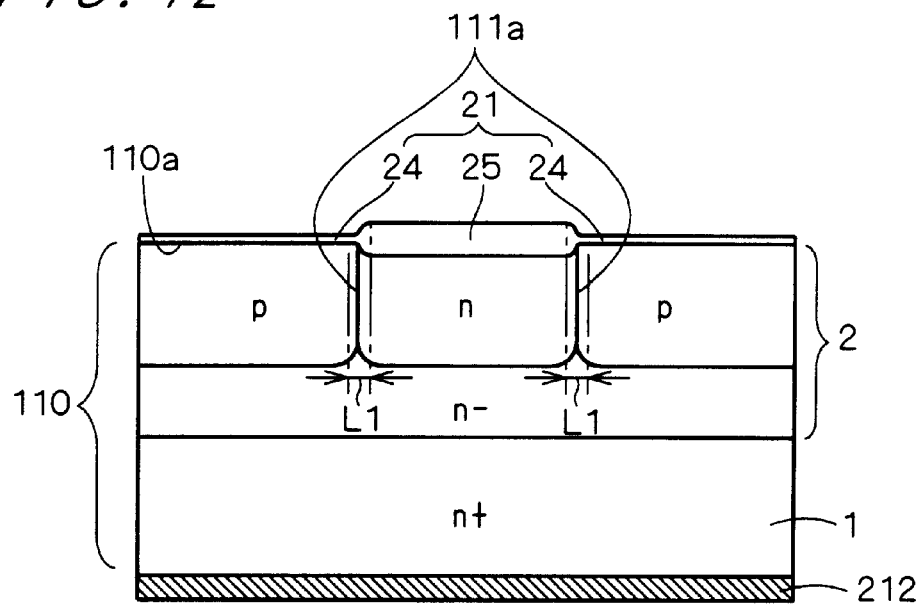

The step of completely removing the oxide film 21 of FIG. 12 may be performed prior to the formation of the n⁺ diffusion regions 113 and the control electrode 211 or performed after the implantation of boron into the regions 111R of FIG. 11 and before the heat treatment of FIG. 12.

Figure 14:
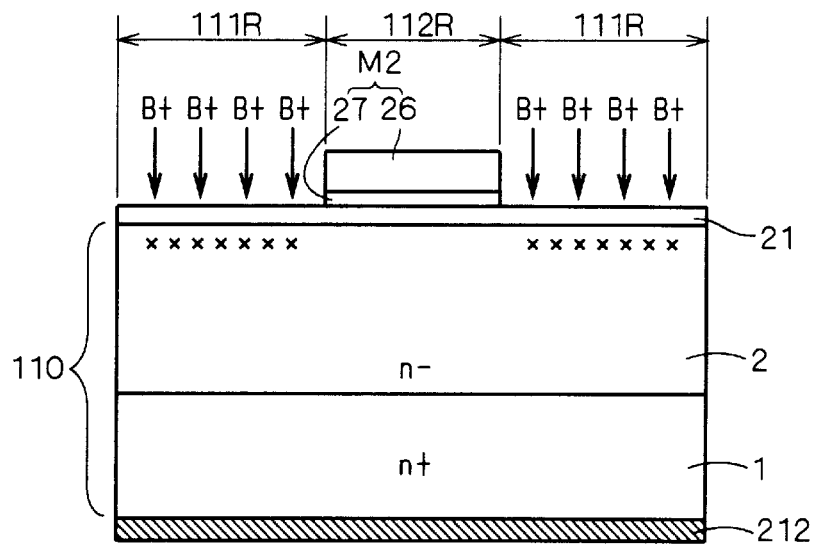
Figure 15:
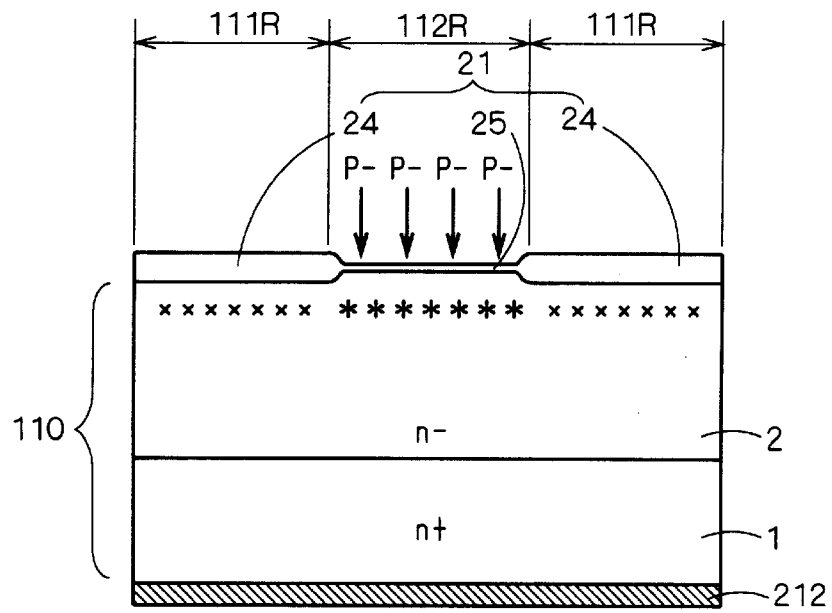

Further, the phosphorus implantation may follow the boron implantation. Specifically, part of the oxide film 21 which overlies the region 112R is covered with a mask M2 comprised of a silicon nitride film 26 and a photoresist 27, and then boron ions are implanted into the regions 111R (FIG. 14). Next, the regions 24 of the oxide film 21 which are exposed over the regions 111R are oxidized to increase the thickness thereof. Thereafter, phosphorus ions may be implanted into the region 112R (FIG. 15).

Additionally, although the p-type diffusion regions 111, the n-type diffusion region 112 and the n⁺ diffusion regions 113 are formed in the n⁻ epitaxial layer 2, these diffusion regions may be formed in the semiconductor substrate 1, with the n⁻ epitaxial layer 2 dispensed with.

Thus, the first preferred embodiment which is the application of the concept of the present invention can suppress the decrease in breakdown voltage and greatly reduce the on-resistance as described with respect to the concept of the present invention. Further, the distance between the boundaries 111a and 111b of FIG. 5, i.e. a channel length, is varied depending on the photolithography for the formation of the control electrode 211 and the photolithography for the patterning of the photoresist 23. However, this variation is greatly improved by technical improvements at the present time, and the channel length may be thereby reduced. Therefore, the first preferred embodiment is more advantageous than the technique of the second approach applied to the first approach described with respect to the background art, and can greatly improve the tradeoff between breakdown voltage and on-resistance.

It is now considered that the plan configuration of the semiconductor device of FIG. 4 is a square with each side having a length a. As described with respect to the concept of the present invention, the on-resistance may be greatly reduced. Thus, the on-resistance is not increased if the length a that is equal to a gate width of FIG. 4 is decreased (i.e., the size of the semiconductor device is reduced).

Second Preferred Embodiment

Figure 16:
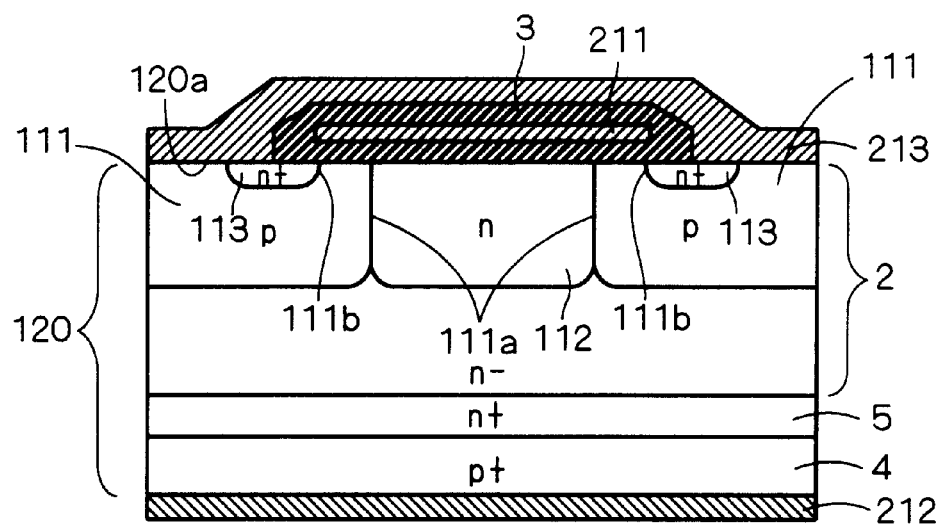
FIG. 16 is a cross-sectional view of the semiconductor device according to a second preferred embodiment of the present invention.

FIG. 16 is a cross-sectional view of the semiconductor device according to the second preferred embodiment of the present invention. The semiconductor device of the second preferred embodiment is a discrete IGBT (Insulated Gate Bipolar Transistor).

The structure of FIG. 16 is such that the semiconductor layer 110 in the structure of FIG. 5 is replaced with a semiconductor layer 120. Thus, the components of FIG. 16 except the semiconductor layer 120 are similar to those of the first preferred embodiment.

The semiconductor layer 120 corresponds to the semiconductor layer 100 of FIG. 1, and comprises a p⁺ semiconductor substrate 4, an n⁺ layer 5 formed on the semiconductor substrate 4, and the n⁻ epitaxial layer 2 formed on the n⁺ layer 5. The n⁻ epitaxial layer 2 is similar to that of the first preferred embodiment.

The reference character 120a designates a main surface of the semiconductor layer 120 which corresponds to the main surface 100a of FIG. 1, and 120b designates a bottom surface of the semiconductor layer 120 which corresponds to the bottom surface 100b of FIG. 1.

Figure 17:
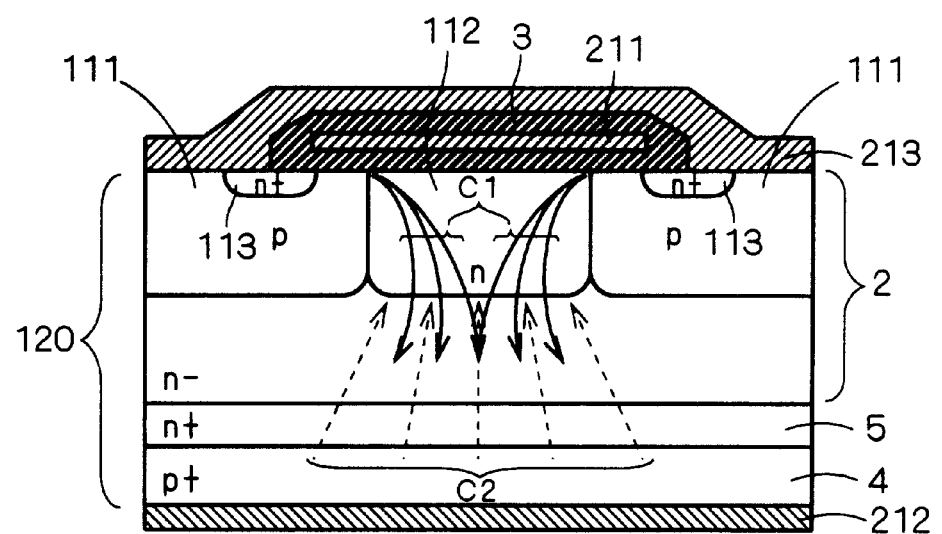
FIG. 17 is a cross-sectional view showing the operation of the semiconductor device according to the second preferred embodiment of the present invention.

The second preferred embodiment, like the first preferred embodiment, can greatly improve the tradeoff between breakdown voltage and on-resistance. This indicates that more electron current C1 (FIG. 17) is permitted to flow at the same breakdown voltage. Since the on-resistance of the IGBT greatly depends on the density of the electron current C1, the performance of the IGBT may be improved.

A primary operation of the IGBT is to cause conductivity modulation in an n region included in the n⁻ epitaxial layer 2. The conductivity modulation in the case of FIG. 17 means that hole current C2 is supplied from the semiconductor substrate 4 into the n⁻ region included in the n⁻ epitaxial layer 2 to cause the n⁻ region to function as if it were an n⁺ region. The n-type diffusion region 112 prevents the hole current C2 from flowing into the source electrode 213 to increase the effect of the conductivity modulation. Therefore, the performance of the IGBT may be improved.

Third Preferred Embodiment

Figure 18:
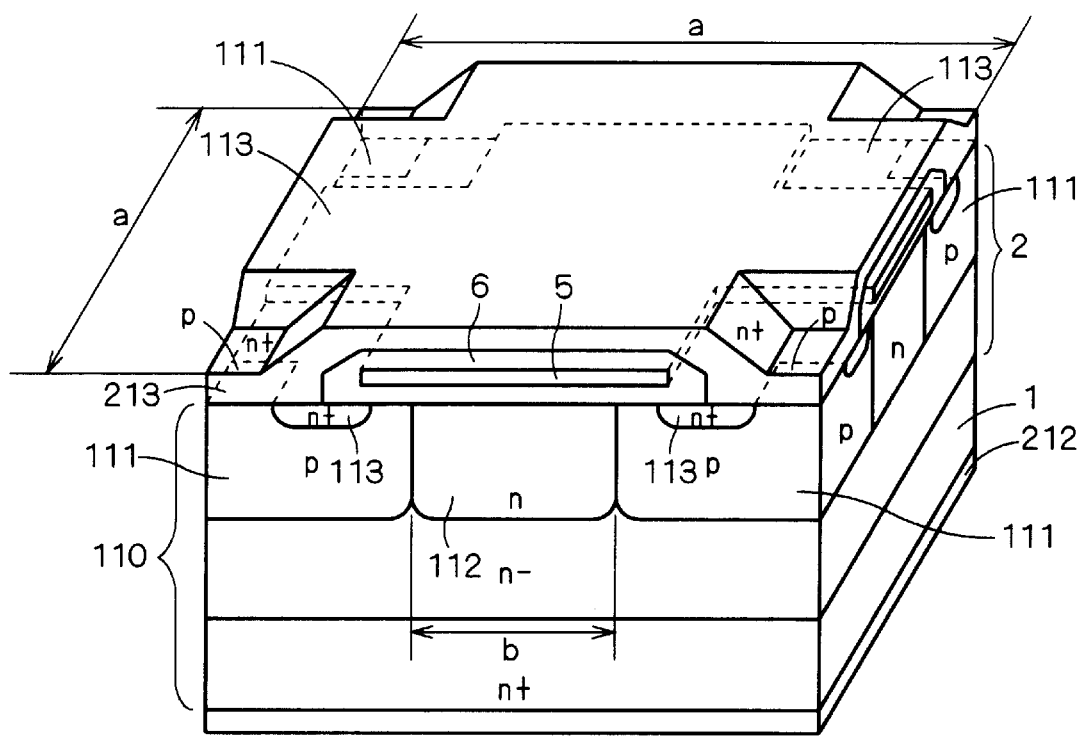
FIG. 18 is a bird's eye view of the semiconductor device according to a third preferred embodiment of the present invention.

The third preferred embodiment features the semiconductor device of the first or second preferred embodiment which is formed into a cell type. FIG. 18 is a bird's eye view of the semiconductor device of the third preferred embodiment which is the semiconductor device of the first preferred embodiment formed into the cell type. As shown in FIG. 18, the cell type semiconductor device has a plurality of independent p-type diffusion regions 111 disposed at the vertices of the plan configuration of the main surface of the semiconductor layer 110 and electrically connected to each other through the source electrode 213. Each of the four side surfaces of the structure of FIG. 18 shows the structure of FIG. 5.

When the plan configuration of the semiconductor device of FIG. 18 is a square with each side having a length a, the gate width r per unit area is $$r=4(a-b)/a^2$$

where b is the width of the n-type diffusion region 112. For the semiconductor device shown in FIG. 4, the gate width r per unit area is $$r=2a/a^2=2/a$$

If a/2>b, the gate width r per unit area for the cell type semiconductor device is greater than that for the stripe type semiconductor device shown in FIG. 4. Therefore, when the relationship a/2>b is satisfied, the use of the cell type semiconductor device provides a lower on-resistance than the use of the stripe type semiconductor device if the semiconductor device is reduced in size.

The p-type diffusion regions 111 disposed at the vertices of the plan configuration of the main surface of the semiconductor layer 110 are prone to cause an electric field concentration thereat and are accordingly susceptible to breakdown. According to the present invention, however, the boundaries between the p-type diffusion regions 111 and the n-type diffusion region 112 contain at least the planar boundaries 111a. This accordingly alleviates the electric field concentration to render the semiconductor device less susceptible to breakdown.

The main surface of the semiconductor layer 110 is shown in FIG. 18 as having a quadrilateral plan configuration, but may be of other polygonal plan configurations such as a triangle and a pentagon.

Fourth Preferred Embodiment

Figure 19:
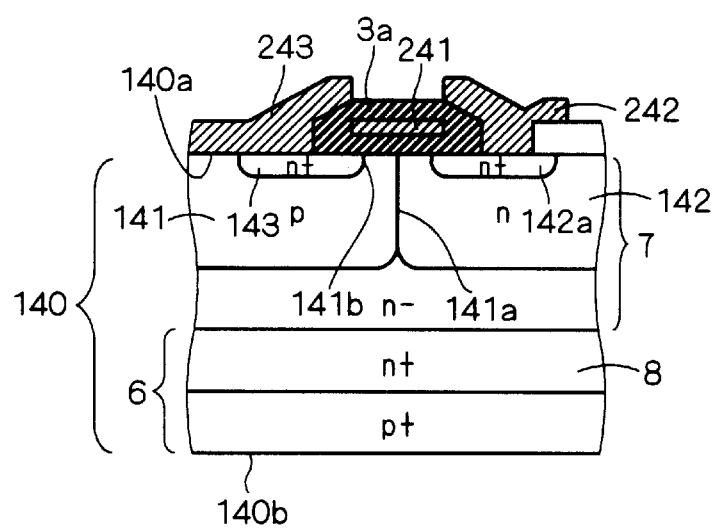
FIG. 19 is a cross-sectional view of the semiconductor device according to a fourth preferred embodiment of the present invention.

FIG. 19 is a partial cross-sectional view of the semiconductor device according to the fourth preferred embodiment of the present invention. The semiconductor device of the fourth preferred embodiment is an integrated circuit.

The semiconductor device of the fourth preferred embodiment comprises a semiconductor layer 140, a control electrode 241, a drain electrode 242, a source electrode 243 and an insulation film 3a.

The semiconductor layer 140 includes a p⁺ semiconductor substrate 6, and an n⁻ epitaxial layer 7 formed on the semiconductor substrate 6. The n⁻ epitaxial layer 7 includes a p-type diffusion region 141, an n-type diffusion region 142, an n⁺ diffusion region 143, and an n⁺ diffusion region 142a. The n⁺ diffusion region 142a is surrounded by the n-type diffusion region 142. The insulation film 3a surrounds the surfaces of the control electrode 241.

The semiconductor substrate 6 has an n⁺ buried diffusion region 8 formed closer to a main surface 140a of the semiconductor layer 140 by burying an n-type impurity. The n⁺ buried diffusion region 8 may be used as part of the drain.

The p-type diffusion region 141 and the n-type diffusion region 142 have a boundary 141a formed therebetween, and the p-type diffusion region 141 and the n⁺ diffusion region 143 have a boundary 141b formed therebetween. The boundary 141a adjacent the main surface 140a is perpendicular to the main surface 140a. The depth of the n⁺ diffusion region 143 from the main surface 140a is less than the depth of the boundary 141a from the main surface 140a. The reference character 140b designates a bottom surface of the semiconductor layer 140.

The control electrode 241 overlies the main surface 140a of the semiconductor layer 140, with the insulation film 3a therebetween, so as to extend from the boundary 141a to the boundary 141b. The drain electrode 242 and the source electrode 243 are provided on the main surface 140a of the semiconductor layer 140.

The semiconductor layer 140, the main surface 140a, the bottom surface 140b, the p-type diffusion region 141, the boundary 141a, the boundary 141b, the n-type diffusion region 142, the n⁺ diffusion region 143, the control electrode 241, the drain electrode 242, and the source electrode 243 according to the fourth preferred embodiment correspond respectively to the semiconductor layer 100, the main surface 100a, the bottom surface 100b, the first region 101, the first boundary 101a, the second boundary 101b, the second region 102, the third region 103, the control electrode 201, the second current electrode 202, and the first current electrode 203 which are described with respect to the concept of the present invention.

Thus, the fourth preferred embodiment which is also the application of the concept of the present invention can suppress the decrease in breakdown voltage and yet greatly reduce the on-resistance as described with respect to the concept of the present invention. Further, the distance between the boundary 141a and the boundary 141b, i.e. the channel length, may be sufficiently shortened by the state-of-the-art technique. Therefore, the fourth preferred embodiment is more advantageous than the second approach described with respect to the background art, and can greatly improve the tradeoff between breakdown voltage and on-resistance.

The p-type diffusion region 141 and the n-type diffusion region 142 may be formed using few additional steps by utilizing the step of forming wells which is included in CMOS formation, thereby to improve the tradeoff between breakdown voltage and on-resistance.

While the invention has been described in detail, the foregoing description is in all aspects illustrative and not restrictive. It is understood that numerous other modifications and variations can be devised without departing from the scope of the invention.

What is claimed is:

1. A semiconductor device comprising:
   a semiconductor layer including a main surface, a first region of a first conductivity type, a second region of a second conductivity type, and a third region of said second conductivity type, said first region and said second region having a common depth and a first boundary formed therebetween, said first boundary being perpendicular to said main surface, said third region being formed in said first region in spaced apart relation to said second region, said third region having a depth less than the depth of said first boundary from said main surface; and a control electrode insulated from and overlying said main surface and extending from said first boundary to a second boundary formed between said first region and said third region.

2. The semiconductor device according to claim 1, wherein said first region has an impurity concentration decreasing with increase in distance from said main surface of said semiconductor layer.

3. The semiconductor device according to claim 1, wherein said main surface has a polygonal plan configuration, and wherein said first region is disposed at a vertex of said polygonal plan configuration.

* * * * *